United States Patent
Liu et al.

(10) Patent No.: US 7,589,308 B2
(45) Date of Patent: Sep. 15, 2009

(54) METHOD AND APPARATUS FOR REGULATING PHOTO CURRENTS INDUCED BY DOSE RATE EVENTS

(75) Inventors: Harry H L Liu, Maple Grove, MN (US); Anuj Kohli, Apple Valley, MN (US); Michael S Liu, Bloomington, MN (US)

(73) Assignee: Honeywell International Inc., Morristown, NJ (US)

( * ) Notice: Subject to any disclaimer, the term of this patent is extended or adjusted under 35 U.S.C. 154(b) by 158 days.

(21) Appl. No.: 11/469,803

(22) Filed: Sep. 1, 2006

(65) Prior Publication Data

US 2008/0054360 A1    Mar. 6, 2008

(51) Int. Cl.
*H01J 40/14* (2006.01)
*H01L 23/62* (2006.01)

(52) U.S. Cl. .................. 250/214 R; 257/351; 257/355

(58) Field of Classification Search ............ 250/214 R; 257/351, 352, 355
See application file for complete search history.

(56) References Cited

U.S. PATENT DOCUMENTS

| | | | | |
|---|---|---|---|---|
| 4,130,892 | A * | 12/1978 | Gunckel et al. | 365/154 |
| 5,072,169 | A * | 12/1991 | Saul et al. | 323/220 |
| 6,680,833 | B2 * | 1/2004 | Morishita | 361/56 |
| 6,777,753 | B1 | 8/2004 | Summers et al. | |
| 7,286,393 | B2 * | 10/2007 | Hynes et al. | 365/158 |
| 2006/0221675 | A1 * | 10/2006 | Hynes et al. | 365/158 |

* cited by examiner

*Primary Examiner*—Thanh X Luu
(74) *Attorney, Agent, or Firm*—McDonnell Boehnen Hulbert & Berghoff LLP

(57) ABSTRACT

A method and apparatus for regulating photocurrents is described. A photocurrent regulator may include a transistor having an associated cross-sectional area. The photocurrent regulator is coupled between an integrated circuit and a voltage source. When a dose rate event occurs within the integrated circuit, the photocurrent regulator, via the cross-sectional area, regulates a recombination path to the voltage source. Consequently, photocurrents within the integrated circuit are regulated, preventing permanent damage within the integrated circuit.

15 Claims, 5 Drawing Sheets

METHOD AND APPARATUS FOR REGULATING PHOTO CURRENTS INDUCED BY DOSE RATE EVENTS

FIELD

The invention relates to the field of radiation hardened integrated circuits, and more particularly to dose rate hardened integrated circuits.

BACKGROUND

When semiconductor devices such as diodes, transistors, and the integrated circuits (ICs) which comprise either of the two, are exposed to ionizing radiation, such as gamma-rays or X-rays, electron-hole pairs are generated within the semiconductor material. These free carriers result in the generation of photocurrents as they are swept through the depletion regions of a p-n junction of the device or integrated circuit. The magnitude of these currents can be orders of magnitude greater than normal signal levels and can result in temporary or permanent system failure. Such photocurrent generation is generally referred to as a dose rate event.

When a photocurrent is induced, the electron free carriers will seek to be grounded, traveling through various circuit nodes until reaching a ground node. Similarly, hole free carriers will travel through an IC until reaching a power supply node. Because the magnitude of either the hole and/or electron currents may be quite large, permanent damage may occur as a ground node or a power supply node is sought out. For example, signal lines may be rapidly heated, via resistive heating, and fused together; high currents may rapidly decrease transistor performance (i.e., hot carrier effects); and, data states within the IC may be corrupted.

SUMMARY

Therefore, a method for regulating a photocurrent is presented. The method includes coupling a metal oxide semiconductor (MOS) transistor between a voltage source and a plurality of nodes within an IC. The voltage source provides a voltage to the nodes (e.g., a ground or a power supply voltage) through the transistor. When a photocurrent is induced, the electron/hole recombination is limited by a recombination path to the voltage source. The transistor determines a cross-sectional area associated with the recombination path, and thus regulates the photocurrent. Photocurrent regulation may be increased by decreasing the cross-sectional area and may be decreased by increasing the cross-sectional area. In one example, a source of the transistor is coupled to the voltage source and a drain of the transistor is coupled to the plurality of nodes.

As an alternative example, a photocurrent regulator is described, which comprises an MOS transistor having a source for coupling to a voltage source and a drain for coupling to an IC. Accordingly, a cross-sectional area associated with the transistor may be determined for photocurrent regulation. In one example, the cross-sectional area is defined by a width and a diffusion depth. In another example, the transistor may be fabricated in a silicon-on-insulator (SOI) process and the cross-sectional area may be defined by a width and a device layer thickness.

In yet another example, an example method includes selecting a cross-sectional area of a MOS transistor. The value of the cross-sectional area is correlative with an amount of photocurrent regulation and may be used to regulate a photocurrent induced in an IC. The transistor may be coupled to a voltage source. In one example the transistor is an n-type transistor, which is used to couple the IC to a ground or 0V potential. In another example, the transistor may be a p-type transistor, which is used to couple the IC to a power supply voltage.

These as well as other aspects and advantages will become apparent to those of ordinary skill in the art by reading the following detailed description, with reference where appropriate to the accompanying drawings. Further, it is understood that this summary is merely an example and is not intended to limit the scope of the invention as claimed.

BRIEF DESCRIPTION OF THE DRAWINGS

Certain examples are described below in conjunction with the appended drawing figures, wherein like reference numerals refer to like elements in the various figures, and wherein.

DETAILED DESCRIPTION

Figure 1:
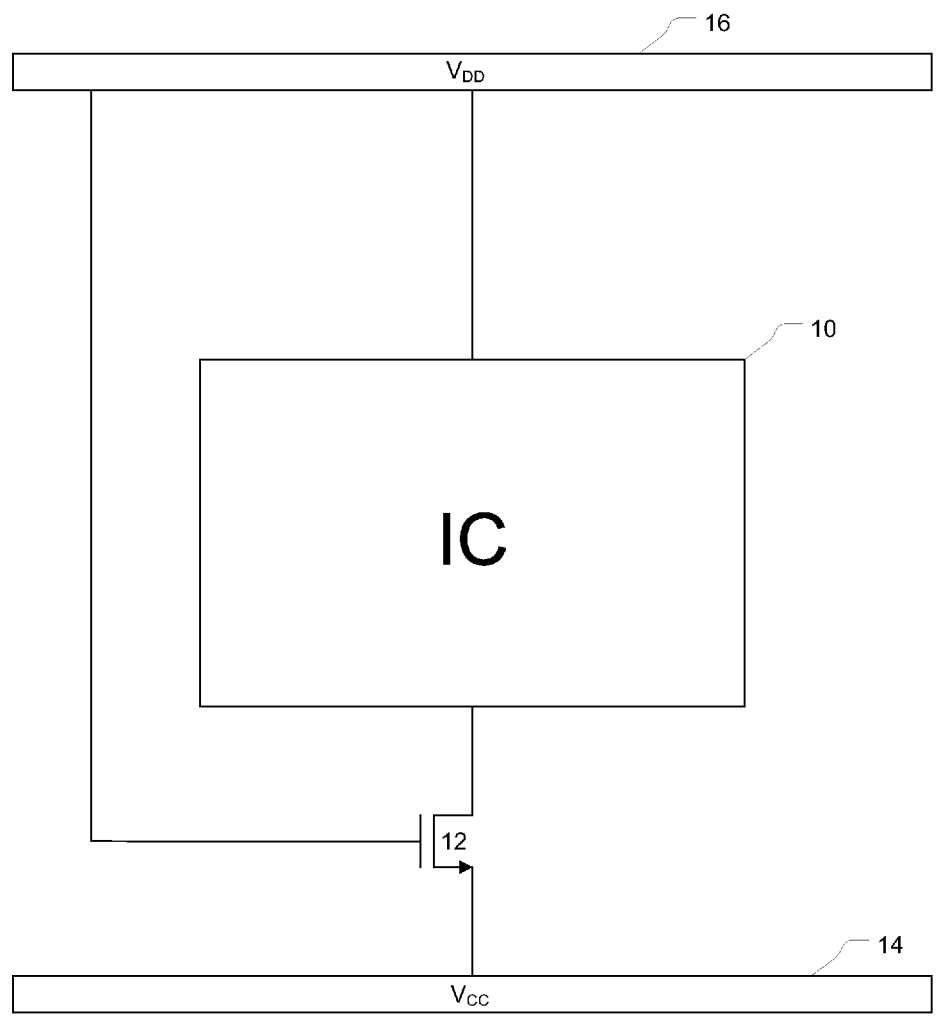
FIG. 1 is a block diagram of a photocurrent regulated IC including an n-type MOS transistor, according to an example.

Turning now to the figures, FIG. 1 shows an IC 10 and an n-type MOS transistor 12. The transistor 12 is coupled between the IC 10 and a ground, $V_{CC}$, or 0 V voltage source. The IC 10 is also coupled to a power supply voltage, $V_{DD}$. $V_{DD}$ and $V_{CC}$ may be respectively applied at buses 14, 16. The transistor 12 may include a source terminal coupled to the bus 14, a gate coupled to the bus 16, and a drain coupled the IC 10.

It should be understood that the IC 10 may comprise a variety of components (e.g., transistors, capacitors, resistors, inductors, diodes, etc.) in many different types of configurations. Thus, in the FIGS. 1-5, an IC is shown generally as a box, in order to convey one of many possible circuit arrangements. Further, the IC may be located in a variety of semiconductor substrate types such as silicon, silicon-germanium, a III-V or II-VI compound semiconductor, or an alloy of two or more semiconductor materials. Preferably, however, an IC is formed in a silicon-on-insulator (SOI) substrate.

Internal to the IC 10 are circuit components that are supplied a voltage from either of the busses 14, 16. $V_{CC}$, as described above, may be used to provide a ground potential and $V_{DD}$ may provide a supply voltage. Within the IC 10, various circuit nodes are coupled to either of these two potentials. For example, internal to the IC 10, an emitter of a bipolar junction transistor (BJT) may be coupled to $V_{DD}$ and a collector be coupled to $V_{CC}$. However, in FIG. 1, instead of being directly coupled to $V_{CC}$, the BJT may be coupled to $V_{CC}$ through the transistor 12. In this scenario, the electron current that travels through the BJT must also travel through the transistor 12. It follows that an electron current generated from ionizing radiation (i.e., a dose rate event), must also flow through the transistor 12.

Bearing in mind that electron current destined to $V_{CC}$ must travel through the transistor 12, the amount of current that is capable of traveling through the transistor 12 is then restricted to, or regulated by, the cross-sectional area of the transistor 12. Thus, in the case of large magnitude photocurrents, not all of the photocurrent will be able to flow through the transistor 12 at the same time. Instead, an induced photocurrent will dissipate over a time that is proportional to the cross-sectional area of the transistor 12.

Figure 2:
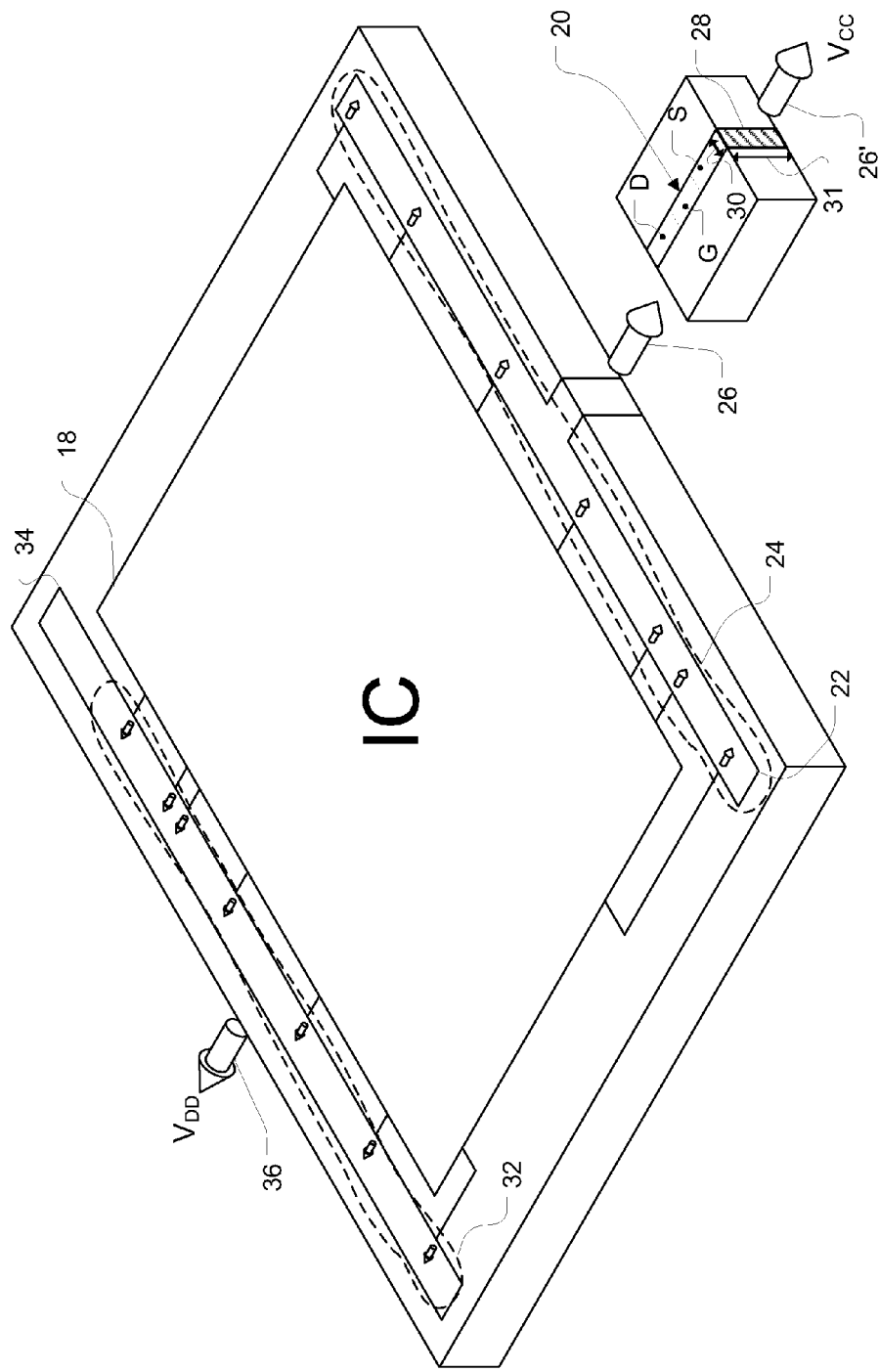
FIG. 2 is an isometric drawing depicting photocurrent regulation using an n-type MOS transistor, according to an example.

FIG. 2 is an isometric diagram of an IC 18 and a substrate portion of an MOS transistor 20. The IC 18 has undergone a dose rate event, which has caused electron-hole pairs (not shown) to generate within the IC 18. The electrons, seeking a ground potential, make their way to a bus 22, which is coupled through the transistor 20 to $V_{CC}$. These electrons form electron recombination currents 24, which then form an aggregated electron recombination current 26. The size of the aggregated electron recombination current 26 is regulated by a cross-sectional area 28 associated with the transistor 20.

The cross-sectional area 28 may be determined by a width 30 of the transistor 20 and a depth 31 of a channel region. The depth 31, for example, may comprise a diffusion depth that is used to establish conductivity within the channel region. Additionally or alternatively, if the transistor is fabricated in SOI, the depth 31 may be determined by an SOI device layer thickness. It is also contemplated that a gate bias may be used to increase or decrease the cross-sectional area 28 by making the channel region more or less conductive.

The size of the aggregated electron recombination current 26 is inversely proportional with the cross-sectional area 28 of the transistor 20. The electron recombination currents 24 are directly proportional to the magnitude of the aggregated recombination current 26. Hole recombination currents 32, shown at a bus 34, are proportional to the electron recombination current 26. And, consequently, an aggregated hole recombination current 36 is proportional to the aggregated electron recombination current 26. Thus, the cross-sectional area 28 of the transistor 20 determines the magnitude of the recombination currents 24, 26, 32, 36. It should also be noted that the dissipation time of the electron-hole pairs may also be inversely proportional with the size of the cross-sectional area 28.

Figure 3:
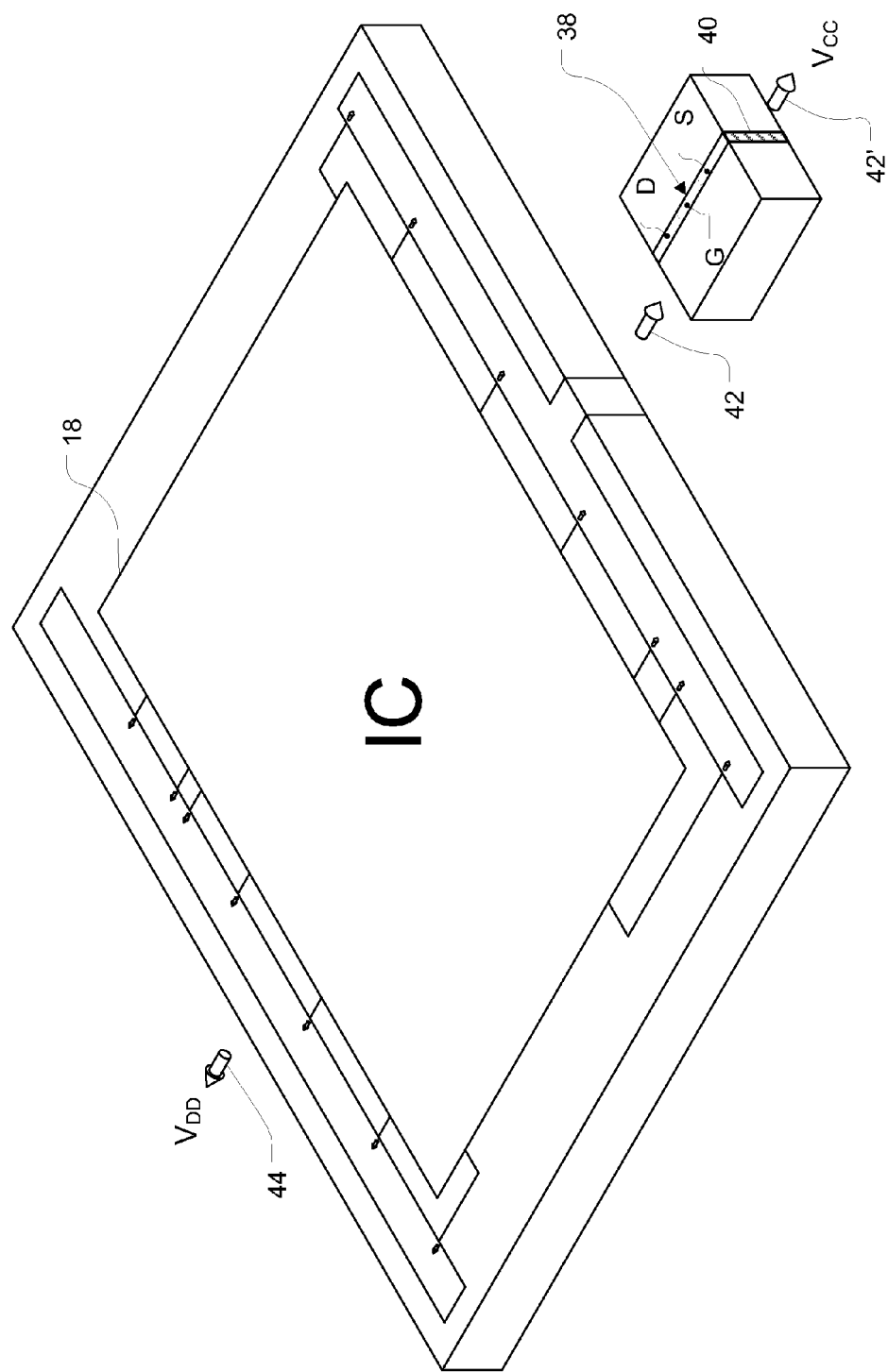
FIG. 3 is another isometric drawing showing an increase in photocurrent regulation relative to FIG. 2, according to an example.

FIG. 3 shows the IC 18 and a MOS transistor 38 having a cross-sectional area 40. The cross-sectional area 40 is smaller than the cross-sectional area 28, creating a smaller aggregated electron recombination current 42 (relative to FIG. 2). Accordingly, reducing the electron recombination current reduces the hole recombination current, yielding a reduced aggregated hole current 44.

Figure 4:
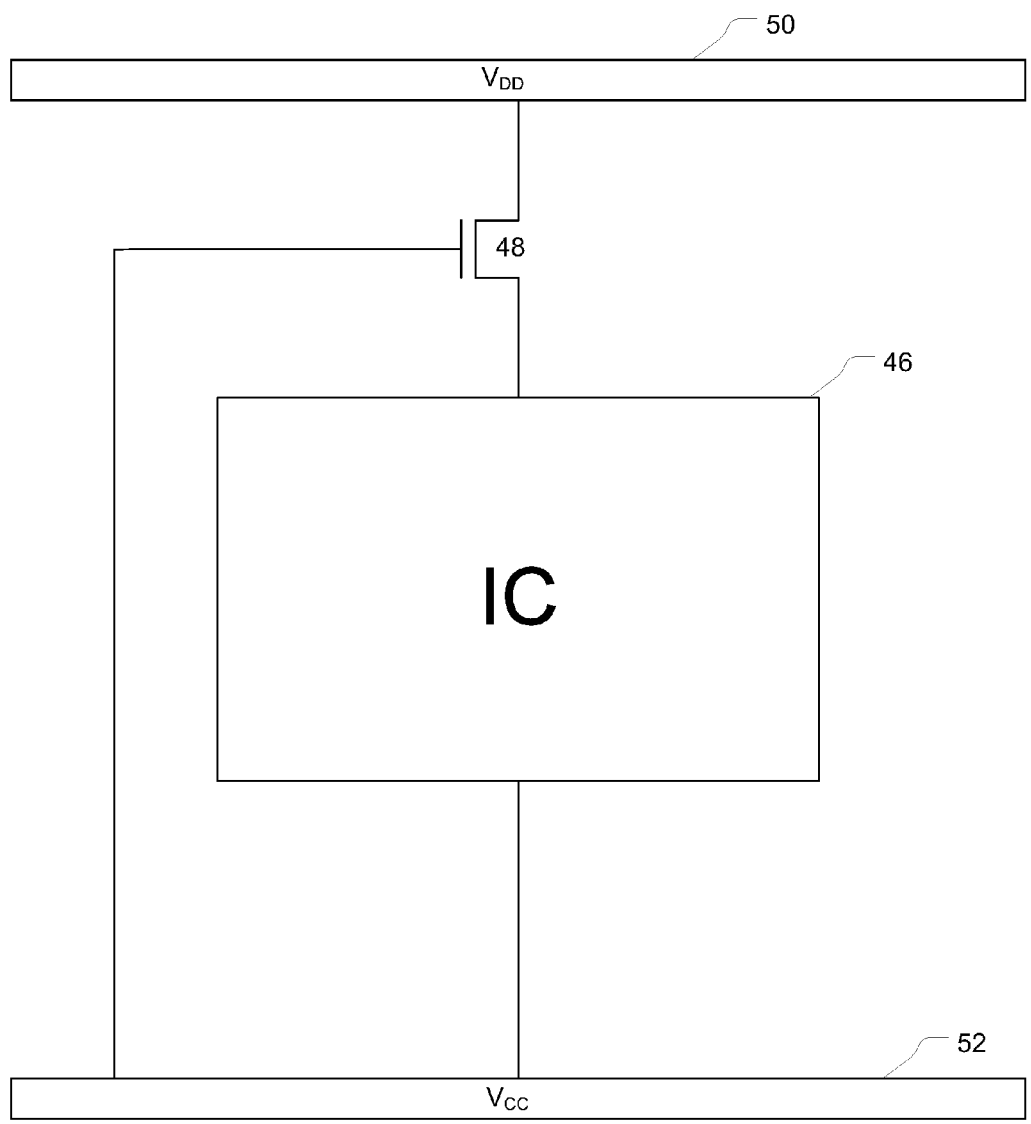
FIG. 4 is a block diagram of a photocurrent regulated IC including a p-type MOS transistor, according to an example.

The configuration shown in FIGS. 1-3 may be referred to as a footer configuration. It may be preferable to use an n-type MOS transistor in such a configuration, as n-channel devices are generally stronger drivers than p-channel devices of the same size. However, a p-type MOS transistor may be used in a header configuration, and provide the same regulating functionality. FIG. 4 shows such a scenario, where an IC 46 is coupled to a p-type MOS transistor 48. The transistor 48 is used to couple a bus 50, at $V_{DD}$, to the transistor 48. The IC 46 is directly coupled to $V_{CC}$ at a bus 52.

Figure 5:
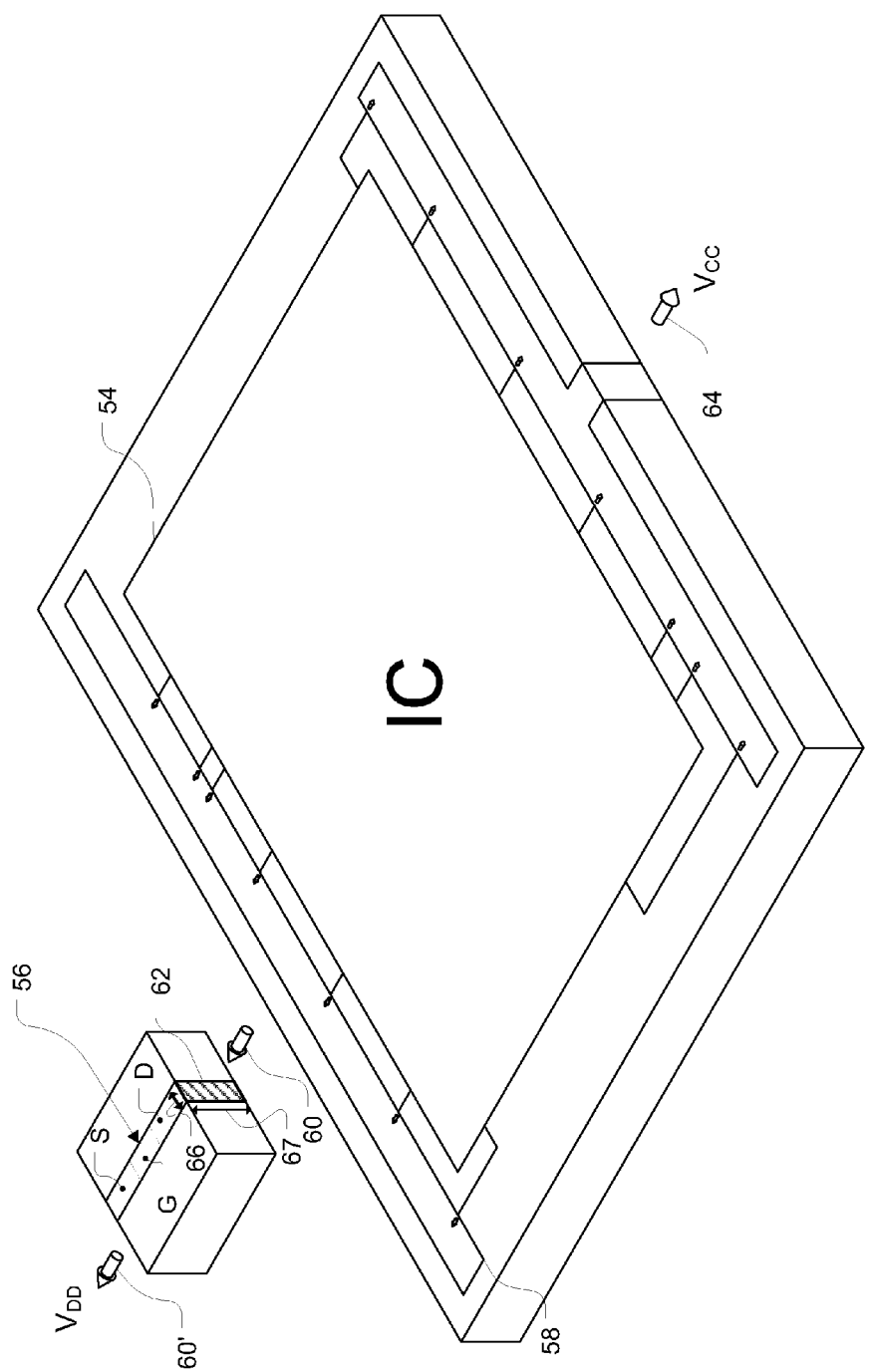
FIG. 5 is an isometric drawing depicting photocurrent regulation using a p-type MOS transistor, according to an example.

FIG. 5 is an isometric diagram of an IC 54 and a substrate portion of a MOS transistor 56 in a header configuration. Similar to FIGS. 2-3, the IC 54 has undergone a dose rate event, which has caused electron-hole pairs (not shown) to generate within the IC 54. The holes make their way to a bus 58, which is coupled through the transistor 56 to $V_{DD}$. An aggregated hole recombination current 60 is produced. The aggregated hole recombination current 60 is regulated by a cross-sectional area 62 of the transistor 56. Because the electron recombination current is dependent on the hole recombination current (and vice versa), an aggregate electron recombination current 64 is likewise regulated by the cross-sectional area 62. The cross-sectional area 62 may be increased or decreased to respectively decrease or increase the aggregated hole recombination current 60. For example, a width 66 of the transistor 56 may adjusted. Additionally or alternatively, a depth 67, such as a diffusion depth or a device layer thickness, may also be adjusted.

It should be noted that the ICs describe above may be a portion of a larger IC. For example, the portion of a larger IC may be sized to meet the drive requirements of a transistor. The larger IC, in that scenario, may comprise one or more IC portions similar or equivalent to the configuration shown in any of the FIGS. 1-5. Generally speaking, the drive strength of a transistor in a header or a footer configuration should be greater than all of the "on" devices at any given time within the IC. Consequently, consideration should be given so that a transistor has a small cross-sectional area, which protects against dose rate events, but retains sufficient drive strength.

A variety of examples have been described above. The above description has described a photocurrent regulator coupled to an IC, which yields a photocurrent regulated IC. Also, the description has described how the cross-sectional area of a transistor may be used to regulate photocurrent (i.e., electron-hole pairs), which are generated in a dose-rate event.

Those skilled in the art will understand that changes and modifications may be made to these examples without departing from the true scope and spirit of the present invention, which is defined by the claims. Thus, for example, the description above generally describes nodes within an IC as being coupled to a bus, where the bus is coupled to either $V_{DD}$ or $V_{CC}$ through a transistor acting as a photocurrent regulator. However, a transistor is not limited to being coupled exclusively to a "bus". Instead, the described illustrations generally convey one way in which a transistor may receive either an electron or a hole recombination current. Other configurations are possible. Also, the illustrations should not be construed to be to-scale. For example, the transistors 20, 38, and 50 are shown relatively large compared to the ICs in FIGS. 2, 3, and 5.

Accordingly, the description of the present invention is to be construed as illustrative only and is for the purpose of teaching those skilled in the art the best mode of carrying out the invention. The details may be varied substantially without departing from the spirit of the invention, and the exclusive use of all modifications which are within the scope of the appended claims is reserved.

We claim:

1. A photocurrent regulator, consisting of a single n-type MOS transistor connected in series to an integrated circuit, the n-type MOS transistor including a gate coupled directly to a first voltage source at a power supply voltage, a source coupled to a second voltage source at a voltage value of about 0V, and a drain coupled to the integrated circuit, whereby all electrical conduction paths from the integrated circuit to the second voltage source travel through the single n-type MOS transistor, and wherein the transistor comprises a cross-sectional area that is selected to be sufficiently small so as to limit a photocurrent that is generated within the integrated circuit during a dose rate event.

2. The regulator as in claim 1, wherein the cross-sectional area is defined by a width and a diffusion depth associated with the transistor.

3. The regulator as in claim 1, wherein the cross-sectional area is defined by a width and a device layer thickness associated with the transistor.

4. A photocurrent regulator, consisting of a single p-type MOS transistor connected in series to an integrated circuit, the p-type MOS transistor including a gate coupled directly to a first voltage source at a voltage value of about 0V, a source coupled to a second voltage source at a power supply voltage, and a drain coupled to the integrated circuit, whereby all electrical conduction paths from the integrated circuit to the second voltage source travel through the single p-type MOS transistor, and wherein the transistor comprises a cross-sectional area that is selected to be sufficiently small so as to limit a photocurrent that is generated within the integrated circuit during a dose rate event.

5. The regulator as in claim 4, wherein the cross-sectional area is defined by a width and a diffusion depth associated with the transistor.

6. The regulator as in claim 4, wherein the cross-sectional area is defined by a width and a device layer thickness associated with the transistor.

7. A method for regulating a photocurrent induced during a dose rate event, the method consisting of:

providing an integrated circuit having a plurality of nodes for receiving a voltage;

regulating said photocurrent induced in the integrated circuit by coupling a single MOS transistor in series between at least one of the plurality of nodes and a first voltage source that provides the voltage, wherein the MOS transistor has a cross-sectional area designed to be sufficiently small so as to limit the photocurrent, and wherein the MOS transistor includes a source for coupling to the first voltage source, a gate for coupling directly to a second voltage source, and a drain for coupling to the at least one of the plurality of nodes, and whereby all electrical conduction paths from the integrated circuit to the first voltage source travel through the single MOS transistor.

8. The method as in claim 7, wherein the first voltage source comprises a voltage value of about 0V.

9. The method as in claim 8, wherein the transistor is n-type.

10. The method as in claim 9, wherein the second voltage source comprises a power supply voltage.

11. The method as in claim 7, wherein the first voltage source comprises a power supply voltage.

12. The method as in claim 11, wherein the transistor is p-type.

13. The method as in claim 12, wherein the second voltage source comprises a voltage value of about 0V.

14. The method as in claim 7, wherein the cross-sectional area is defined by a width and a diffusion depth associated with the transistor.

15. The method as in claim 7, wherein the cross-sectional area is defined by a width and a device layer thickness associated with the transistor.

* * * * *